(12) United States Patent
Holland et al.

(10) Patent No.: US 8,441,031 B2
(45) Date of Patent: May 14, 2013

(54) ESD PROTECTION DEVICE

(75) Inventors: Steffen Holland, Hamburg (DE); Zhihao Pan, Hamburg (DE)

(73) Assignee: NXP B.V., Eindhoven (NL)

( * ) Notice: Subject to any disclaimer, the term of this patent is extended or adjusted under 35 U.S.C. 154(b) by 22 days.

(21) Appl. No.: 13/016,443

(22) Filed: Jan. 28, 2011

(65) Prior Publication Data
US 2012/0193675 A1      Aug. 2, 2012

(51) Int. Cl.
*H01L 27/06*      (2006.01)
*H01L 29/74*      (2006.01)
*H01L 29/732*     (2006.01)

(52) U.S. Cl.
USPC ........... 257/111; 257/109; 257/124; 257/132; 257/133; 257/E27.017; 257/E29.184; 257/E29.218

(58) Field of Classification Search .......... 257/109, 257/110, 111, 124, 132, 133, E27.019, E29.184, 257/E29.218
See application file for complete search history.

(56) References Cited

U.S. PATENT DOCUMENTS

| | | | |
|---|---|---|---|
| 3,351,826 A | | 11/1967 | Hermann |
| 6,258,634 B1* | | 7/2001 | Wang et al. ............. 438/133 |
| 6,365,924 B1* | | 4/2002 | Wang et al. ............. 257/110 |
| 6,512,662 B1 | | 1/2003 | Wang |
| 6,586,780 B1* | | 7/2003 | Terashima ............. 257/140 |
| 6,803,633 B2 | | 10/2004 | Mergens et al. |
| 2005/0002141 A1* | | 1/2005 | Reynders et al. ............ 361/91.1 |
| 2008/0067605 A1* | | 3/2008 | Tyler et al. ............. 257/369 |
| 2008/0217729 A1* | | 9/2008 | Disney et al. ............. 257/513 |
| 2009/0309128 A1 | | 12/2009 | Salcedo et al. |
| 2010/0008002 A1 | | 1/2010 | Sorgeloos |

FOREIGN PATENT DOCUMENTS
EP      1482554 A1      1/2004

OTHER PUBLICATIONS

Extended European Search Report, European Patent Office, May 16, 2012.

* cited by examiner

*Primary Examiner* — Victor A Mandala

(57) ABSTRACT

Electrostatic discharge (ESD) protection is provided for discharging current between input and output nodes. In accordance with various embodiments, an ESD protection device includes an open-base transistor having an emitter connected to the input node and a collector connected to pass current to the output node via a resistor in response to a voltage at the input node exceeding a threshold that causes the transistor to break down. The resistor is coupled across emitter and collector regions of a second open-base transistor that is configured to turn on for passing current in response to the current across the resistor exceeding a threshold that applies a threshold breakdown voltage across the second transistor. In some implementations, an emitter and/or base of the second transistor are connected to, or are respectively the same region as, a base and a collector of the first transistor.

20 Claims, 11 Drawing Sheets

ESD PROTECTION DEVICE

The present disclosure relates generally to electrostatic discharge (ESD) protection, and more specifically to an electrostatic discharge (ESD) protection device.

ESD protection devices are used to protect a variety of integrated circuits and systems. System level ESD protection devices are specially designed for providing protection against ESD pulses without hampering the normal mode of operation (i.e., operation under non-ESD conditions and within an operational voltage/current range). An ESD protection device has a clamping voltage that generally relates to a threshold voltage drop over the ESD protection device, at which the device turns on to pass/shunt current. For example, this threshold voltage may occur as a first peak of an ESD pulse at the onset of an ESD event. In many applications, the maximum voltage of an ESD event is reached at around 20 to 30 ns.

The present invention is exemplified in a number of implementations and applications, some of which are summarized below.

In accordance with various example embodiments, an ESD protection device provides protection against ESD pulses for a system. The ESD device includes a plurality of contiguous semiconductor regions of alternating conductivity type including first and second regions that form a first P-N junction therebetween, a third region that forms a P-N junction with the second region, a fourth region that forms a P-N junction with the third region and a fifth region that forms a P-N junction with the fourth region. A first contact is connected to the first region, and a second contact is connected to the fifth region. A resistor is connected between the third region and the fifth region. The resistor and the first, second, third and fifth regions form a first current path configured to flow current between the first and second contacts via the first and fifth regions in response to a voltage exceeding a breakdown threshold of a first transistor formed by the first, second and third regions. The first, second, third, fourth and fifth regions form a second current path configured to flow current between the first and second contacts via the first and fifth regions, in response to the current across the resistor exceeding a threshold at which the voltage across a second transistor formed by the third, fourth and fifth regions reaches a breakdown voltage of the second transistor.

Another example embodiment is directed to an ESD device including a bipolar transistor and thyristor configured to discharge current in response to an ESD event. The bipolar transistor includes an emitter, a collector and a base, and the emitter is connected to a first external contact. The thyristor includes four regions of alternating P-type and N-type semiconductor material, including a first end region connected to the base of the bipolar transistor, with the first end region and the base of the bipolar transistor being made of the same type of semiconductor material. A first intermediate region of the thyristor forms a P-N junction with the first end region, and is connected to the collector of the bipolar resistor. The second region and the collector of the bipolar transistor are made of the same type of semiconductor material. A second intermediate thyristor region forms a P-N junction with the first intermediate region, and is made of the same type of semiconductor material as the first end region. A second thyristor end region forms a P-N junction with the second intermediate region and is connected to a second external contact. The second end region is made of the same type of material as the first intermediate region. A resistor is connected to the collector of the bipolar transistor, the first intermediate region of the thyristor and the second end region of the thyristor.

Various embodiments of the present disclosure are directed to a method for shunting current between first and second contacts. The method is for use with an electrostatic discharge (ESD) circuit having a plurality of contiguous semiconductor regions of alternating conductivity type. The regions include first and second regions that form a first P-N junction therebetween, a third region that forms a P-N junction with the second region, a fourth region that forms a P-N junction with the third region and a fifth region that forms a P-N junction with the fourth region. A resistor is connected between the third region and the fifth region. The first region is connected to the first contact susceptible to an ESD pulse and the fifth region is connected to the second contact. The method is as follows. In response to a voltage at the first contact that causes a voltage drop across a first transistor formed by the first, second and third regions to exceed a threshold voltage of the first transistor, current is passed through a first current path between the first and second contacts. The first current path includes the first transistor, the resistor and the fifth region. In response to the current flowing through the resistor in the first current path exceeding a threshold at which the voltage across the resistor and correspondingly across a second transistor formed by the third, fourth and fifth regions reaches a breakdown voltage of the second transistor, current is passed through a second current path between the first and second contacts. The second current path includes the first, second, third, fourth and fifth regions.

In various embodiments, an ESD protection device is configured with two breakdown voltages. At a first breakdown voltage, current flows from an emitter to a collector of the ESD protection device through a first current path that includes a transistor in series with a resistor. As the voltage drop over the resistor increases to a second breakdown voltage with increasing current flow, a second portion of the device with a second breakdown voltage opens a second current path.

The above discussion is not intended to describe each embodiment or every implementation of the present disclosure. The figures and detailed description that follow more particularly exemplify various embodiments.

The invention may be more completely understood in consideration of the following detailed description of various embodiments of the invention in connection with the accompanying drawings, in which.

Figure 1:
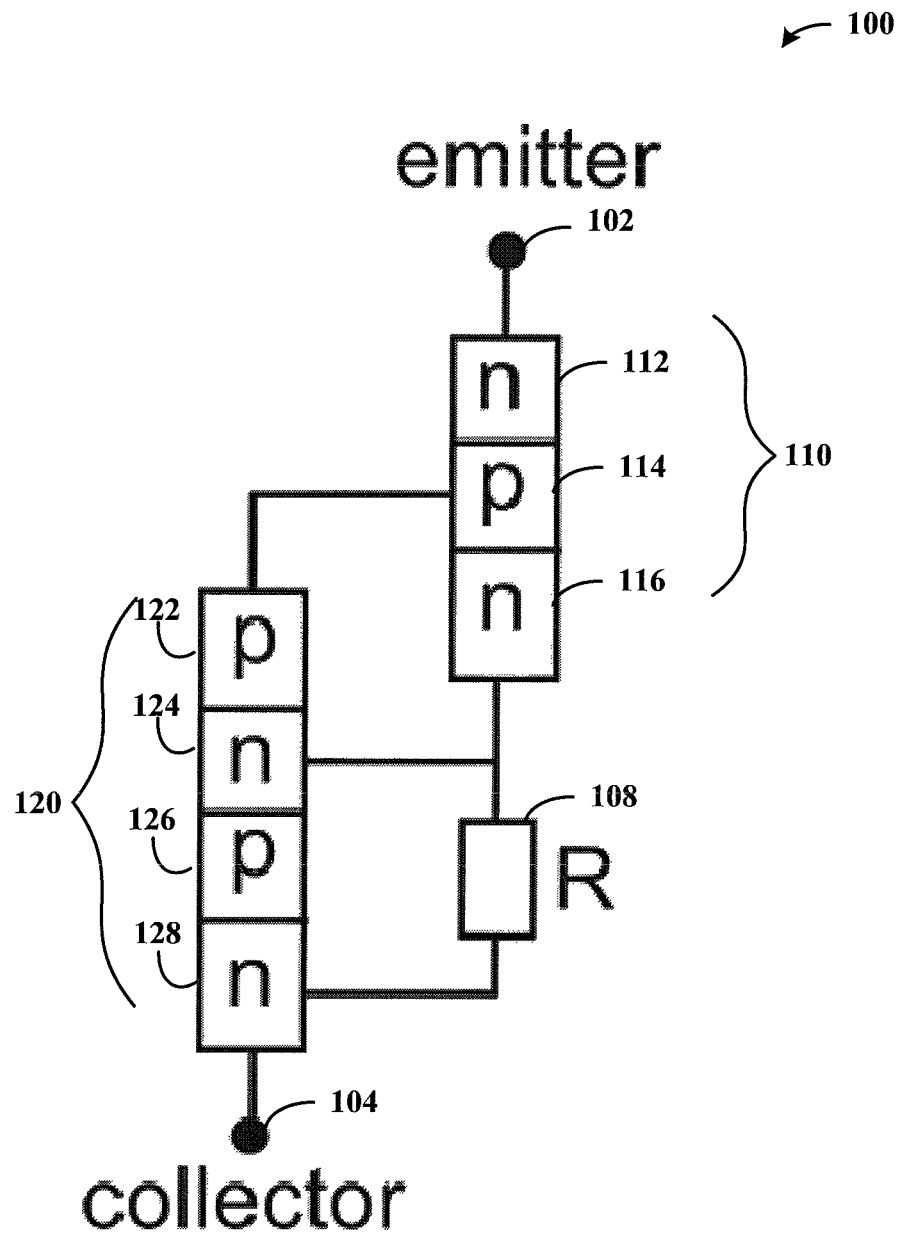
FIG. 1 shows a schematic representation of an ESD protection device, consistent with an embodiment of the present disclosure.

While the disclosure is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined by the claims.

An embodiment of the present disclosure is directed to an ESD protection device having five regions of alternating conductivity types (e.g., P-type and N-type material). The first, third, and fifth regions include a semiconductor material of a first conductivity type, and the second and fourth regions include a semiconductor material of a second conductivity type. For instance, the first, third and fifth regions may be N-type, and the second and fourth regions may be P-type). Each of the regions form P-N junctions with one or more adjacent regions, including junctions between the first and second regions, between the second and third regions, between the third and fourth regions, and between the fourth and fifth regions. A resistor connects the third and fifth regions, with the voltage drop across the resistor being applied across the third, fourth and fifth regions (e.g., with the third, fourth and fifth regions forming a bipolar transistor). The first region is connected to a contact or circuit node at which an ESD pulse is presented, and passes current from such pulses to the fifth region which is also connected to a contact (e.g., ground or a collector).

In a more specific embodiment, the ESD protection device as discussed above is configured to operate as follows. At the onset of an ESD event, a voltage across the first, second and third regions increases to a breakdown voltage level of a first transistor formed by these regions. At this breakdown level, the transistor turns on and conducts current to the second contact, via the resistor. As the current through the resistor increases, the voltage drop across a second transistor formed by the third, fourth and fifth regions increases to a breakdown voltage level of the second transistor. When this voltage drop reaches the breakdown voltage level, the second transistor switches on and passes current from the first transistor to the contact connected to the fifth region, with the flow through the second transistor effecting a low-resistance path, relative to current flow through the resistor. In its on state, the second transistor effects the activation of a thyristor including the second, third, fourth and fifth regions, and which passes current from the first region to the fifth region contact at a low clamping voltage (and a corresponding trigger voltage of the thyristor).

In certain more specific embodiments, an ESD device as discussed above is formed in a semiconductor substrate. The first region is a highly doped region that has been diffused into a lightly-doped epitaxial layer of the substrate, which can be formed in a well region of an opposite conductivity type (e.g., with the well region diffused, buried or doped accordingly).

The third region is a highly doped buried region, with the first, second and third regions operating in accordance with bipolar transistor characteristics. The third region is on the fourth region. In some implementations, the fourth region is separated into two regions that are connected by an internal resistor that connects the third region to the fifth region as discussed above. In this context, the third and fifth regions are connected to one another via the resistor and further by the fourth region (with which the third and fifth regions form P-N junctions and an effective bipolar transistor).

In various embodiments an ESD protection device includes a bipolar transistor, a thyristor, and a resistor, with an emitter of the bipolar transistor connected to an input circuit node susceptible to ESD pulses, and both the resistor and a cathode end of the thyristor connected to an output circuit node (e.g., collector or ground). The bipolar transistor has three regions, acting as an emitter, collector and base. The thyristor has four regions of alternating P-type and N-type material, with first and second ones of the four regions at an anode end of the thyristor connected to or shared with the base and collector of the bipolar transistor. The resistor is connected between the cathode end of the thyristor and the base region of the anode end and the collector of the bipolar transistor (e.g., with the base and collector being connected to one another, or a shared region).

The ESD protection device has two current paths, one regulated by a breakdown voltage of the bipolar transistor and the other further regulated by a trigger voltage of the thyristor. When the voltage across the bipolar transistor exceeds the transistor's breakdown voltage, current flows in a first current path from the input circuit node, through the bipolar transistor and the resistor to the collector/ground circuit node. When the voltage drop across the resistor is at a trigger voltage of the thyristor, current flows through all the regions of the thyristor in a second current path. As otherwise considered, as the voltage drop across the resistor reaches a breakdown voltage of a bipolar transistor formed by the two (middle) base regions and the anode of the thyristor, the bipolar transistor flows current, also turning on the thyristor which settles to its trigger voltage in shunting current to the output node. This arrangement facilitates the reaction of the ESD protection device to the onset of an ESD pulse in stages.

Accordingly, the ESD protection device "turns on" and conducts current through the first current path when the voltage or current of a circuit or device connected to the input circuit node exceeds a predetermined threshold. For example, when the current applied to the emitter of the bipolar transistor increases due to an ESD event, the voltage drop over the resistor increases. When the voltage drop over the resistor reaches a threshold at which the thyristor (and related internal bipolar transistor) switches on, the second current path beings to conduct current.

In various embodiments consistent with the present disclosure, the thresholds or breakdowns for conductance can be described in terms of a breakdown voltage, a trigger voltage, or a current level. The voltage and/or current level needed to turn on various portions of a device are related to the resistance of the device. For example, a voltage drop over a resistor also indicates that a particular current level has been reached. Although many embodiments are discussed with respect to the breakdown voltage or trigger voltage, one of skill in the art would understand that current conductance may be initiated based on the level of current at an emitter reaching a threshold current level that effects the turn-on and related operation of the various regions of opposite polarity.

In certain more specific embodiments, the resistor is an internal resistor. The internal resistance arises from a discontinuity (e.g., a holes or gap) in a doped substrate forming the third region of the thryistor, with the resistance being of a polarity that is common to the polarity of thyristor regions (e.g., third and fifth regions as discussed above), with an alternate doping concentration. This allows current to flow from a cathode-side base (middle) region to an anode end region the thyristor while bypassing the anode-side base (middle) region.

Certain embodiments of the present disclosure are directed to an ESD protection device that provides protection from system level ESD pulses. In certain more specific embodiments, the ESD protection device complies with IEC 6100-4-2. The ESD protection device combines a low capacitance with a low clamping voltage during an ESD event.

ESD protection devices consistent with the present disclosure may be particularly useful for application with high data transfer rates such as USB3.0 and HDMI, where a system level ESD protection device is required to protect sensitive integrated circuits from harmful ESD stress. Both USB3.0 and HDMI have data transfer standards that require very low maximum capacitances in the data lines. Thus, an effective ESD protection device includes a very low maximum capacitance in addition to a low clamping voltage.

In various embodiments as discussed herein, the term thyristor is used to refer to a semiconductor device having four alternating regions of opposite polarity in a series-type arrangement, with p-n junctions between each of the regions. For instance, a p-n-p-n type arrangement of semiconductor regions is characterized in the following drawings, which various embodiments are also applicable to an n-p-n-p type arrangement, with a corresponding n-p-n type of bipolar transistor connected to the thyristor. An alternate consideration of such a structure is of two bipolar transistors, with the collector of one of the transistors being commensurate with the emitter of the other one of the transistors (e.g., with respective breakdown voltages as discussed above). In many applications, such a thyristor-type of device is referred to as a Shockley diode, which is effectively a thyristor with one of its interior n-p regions (the second or third region of four p-n-p-n regions) left floating (e.g., not connected to an external contact).

In various embodiments of the present disclosure, a thyristor is turned on in a controlled way using current passing through an ESD protection device as a controlling parameter. The thyristor turns on in response to a current magnitude that is outside the operating range of an application (e.g., a circuit or device) being protected. The control parameter is based on current, allowing for a device with a very low clamping voltage while avoiding accidental turn on of the thyristor. In addition, due to the relatively high turn-on current of the thyristor, the thyristor and the ESD protection device operate to turn off after the ESD event ends.

Various embodiments are directed to an ESD protection device having two open-base bipolar transistors of the same polarity, as may be implemented consistently with the above discussion. The emitter of the first bipolar transistor is connected directly to an input contact susceptible to ESD pulses. In certain embodiments, the base of the first bipolar transistor is also connected to this contact. The emitter of the second bipolar transistor is connected to or part of the same region as the collector of the first bipolar transistor. The base of the second bipolar transistor is floating, and the collector of the second bipolar transistor is connected to an output contact to which current from the input contact is shunted. The emitter and collector of the second bipolar transistor are connected by a resistor, such that the base of the second transistor does not completely isolate the transistor's emitter and collector.

During normal operation, the collector of the second bipolar transistor is connected to ground, and a negative bias is applied to the emitter of the first bipolar transistor. The emitter-base junction of the first transistor is forward biased and the base-collector junction is reverse biased. When the voltage at the emitter reaches the breakdown voltage of the first transistor, the transistor opens and current flows through the first transistor as well as the resistor. Once the voltage drop over the resistor reaches the breakdown voltage of the second bipolar transistor, current flows through the second bipolar transistor as well as the resistor. The combination of the first and second transistor can be viewed as a thyristor and a diode in this state. The total voltage drop is the holding voltage of the thyristor (including of the first bipolar transistor and the base of the second bipolar transistor) and the breakdown (trigger) voltage of a diode (including of the base and collector of the second bipolar transistor).

In various embodiments an ESD protection device as discussed herein exhibits a voltage drop across input and output nodes that is less than a maximum operating voltage for a particular application in which the ESD protection device is used, with the application involving a circuit that operates within a predefined current range. If the current level at which the ESD protection device goes into thyristor mode is outside of the application's operating current range, the device will safely turn off after an ESD event because the current during normal operation is not enough to provide the voltage drop over the resistor needed to maintain the thyristor in an on (conducting) state (e.g., or turn on the second bipolar transistor). The value of the resistor sets the point at which the second bipolar transistor turns on and off, and therefore controls the operation of the ESD protection device in thyristor mode.

In the figures to follow, the use of plus and minus signs in connection with N or P does not indicate the polarity of the region. Instead, an N indicates a negative N-type semiconductor material and a P indicates a positive P-type semiconductor material. The plus and minus signs indicated the level of doping of the regions. A plus sign indicates a highly doped region, while a minus sign indicates a lightly doped region. In the embodiments to follow the plus and minus signs are used for both N-type and P-type material. Moreover, various regions as described and shown may be implemented with other polarities or doping, to achieve similar functionality, such as by using N-type material where the P-type material is shown and also using P-type material where the N-type material is shown.

FIG. 1 shows a schematic representation of an ESD protection device 100, consistent with an embodiment of the present disclosure. The ESD protection device includes a transistor 110, a thyristor 120 and a resistor 108. The transistor 110 has an emitter 112, an open base 114 and a collector 116, exemplified as respectively N-type, P-type and N-type materials. The thyristor 120 has an anode 122, base (middle) regions 124 and 126, and a cathode 128, respectively exemplified as P-type, N-type, P-type and N-type regions. The base 114 of the transistor 110 is connected the anode 122 of the thyristor 120, and the collector 116 of the transistor is connected to the base region 124 of the thyristor. The resistor 108 is connected to the collector 116 of the transistor 110, and to the base region 124 and the cathode 128 of the thyristor 120.

The ESD protection device 100 is connected to a circuit at an input emitter node 102, for which ESD current is shunted to an output collector node 104. More specifically, the transistor emitter 112 is connected to the emitter node 102, and the thyristor cathode 128 is connected to the collector node 104. The emitter node 102 may, for example, be made of the same type of semiconductor material that the emitter 112 is made of (N-type as shown), or may be one and the same as the emitter 112. Similarly, the collector node 104 may be made of the same type of semiconductor material that the cathode 128 is made of (N-type as shown), or be one and the same as the cathode 128. While shown as connected regions, in certain embodiments the anode 122 and the base 114 are a common region, and/or the collector 116 and the base 124 are also a common region.

When an ESD event occurs, the ESD protection device of FIG. 1 is turned on as the voltage at the emitter node 102 effects a voltage drop across the transistor 110 that reaches the transistor's breakdown voltage, at which the transistor 110 flows current to the collector node 104 via the resistor 108. As the current increases at the emitter 102, the trigger voltage of the transistor 110 is reached and current begins flowing through transistor 110 and across resistor 108.

As the voltage drop across resistor 108 increases with increasing current flow, a breakdown voltage corresponding to thyristor regions 124, 126 and 128 is reached, as also corresponding to a trigger voltage of the thyristor 120. The thyristor turns on in response to reaching the trigger voltage, and current begins to flow through the thyristor as well as the resistor 108. The thyristor provides a low-resistance path at which the device 100 shunts current from the emitter node 102 to the collector node 104.

Figure 2:
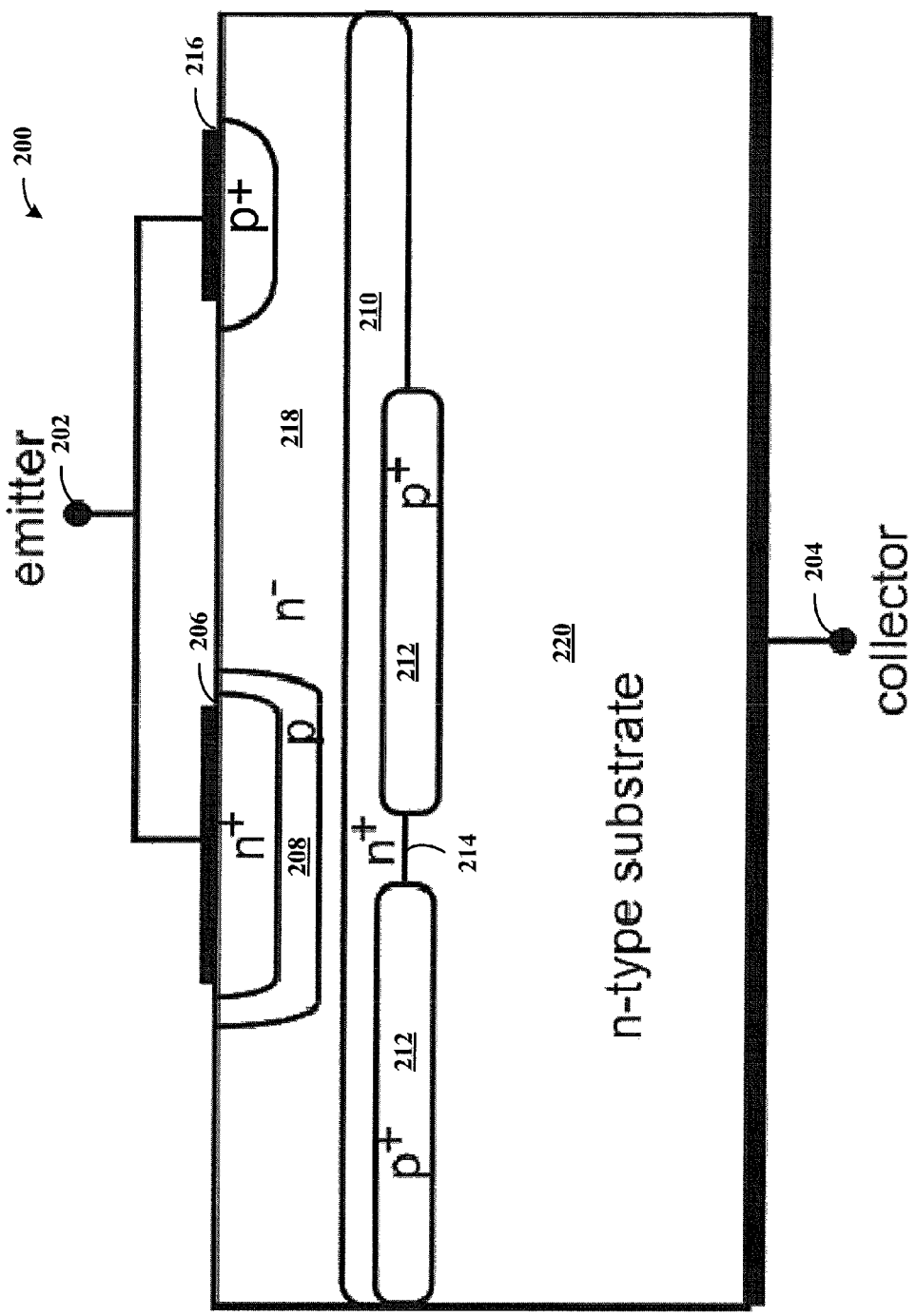
FIG. 2 shows a vertical implementation of an ESD protection device, consistent with an embodiment of the present disclosure.

FIG. 2 shows a vertical implementation of an ESD protection device 200, consistent with another embodiment of the present disclosure. The ESD protection device 200 has a collector 204 connected to a heavily-doped N-type semiconductor substrate 220, and an emitter 202 connected to region 206 for conducting current between the emitter and collector as discussed further below. A buried layer of highly doped P-type semiconductor material 212 is connected between the n-type substrate 220 and an n-type doped layer 210. The p-type region 212 may, for example, be diffused in the N-type substrate 220 using a dopant such as boron, and the n-type layer 210 may be subsequently diffused over the P-type material 212. An internal resistor 214 (e.g., a discontinuity) is located between portions of the P-type semiconductor material 212. An N-type epitaxial layer 218 with very low doping concentration is on top of (e.g., grown on) the N-type doped layer 210, and a P-type base 208 and an N-type emitter 206 are located in (e.g., diffused in) the N-type epitaxial layer 218.

The N-type emitter 206, the P-type base 208 and the buried N-type layer 210 form a transistor. The N-type layer 210, P-type layer 212 and the N-type substrate 220 form a second transistor. The P-type (base) regions 208 and 212 of each of these transistors are floating. As shown, resistor 214 provides a current path between N-type region 210 and N-type substrate 220, mitigating isolation of these N-type regions by the intervening P-type region 212 (e.g., when the n-p-n regions 210, 212 and 220 are not in a conducting state). The doping concentrations of the layers and geometrical dimensions of layer 212 can be set to determine the resistance of the internal resistor 214. The voltage can be designed to be less than the voltage of the application to which the ESD device 200 is attached, and thus tuned (during manufacture) to a specific application.

In some embodiments, the device 200 includes a diode in parallel with the first transistor as discussed above. Specifically, a P-type region at 216 diffused in the N-type layer 218 forms a diode as shown. The P-type region 216 is connected to the emitter 202, which is connected to N-type region 210.

Exemplary operation of the device 200 is as follows. The substrate 220 is connected to ground and a negative bias is applied to emitter 202. The emitter-base junction between regions 206 and 208 is forward biased and a base-collector junction between regions 208 and buried layer 210 (and portion of 218 therebetween) is reverse biased. When the voltage at emitter 202 reaches the trigger voltage of the open base transistor including regions 206, 208 and 210, the transistor opens and current flows through the transistor and the internal resistor 214 to the collector 204. Once the voltage drop over the resistor 214 becomes equal to the breakdown voltage of the buried open transistor including regions 210, 212 and substrate 220, the buried transistor opens and injects holes into the epitaxial layer. The device can be regarded as a thyristor made of regions 206, 208, 210 and buried layer 212, which is in its on state, as well as a diode made of the N-type substrate 220 and the P-type buried layer 212. The total voltage drop is the holding voltage of the thyristor, the breakdown voltage of the diode (if used) and any voltage drop over the substrate.

Figure 3:
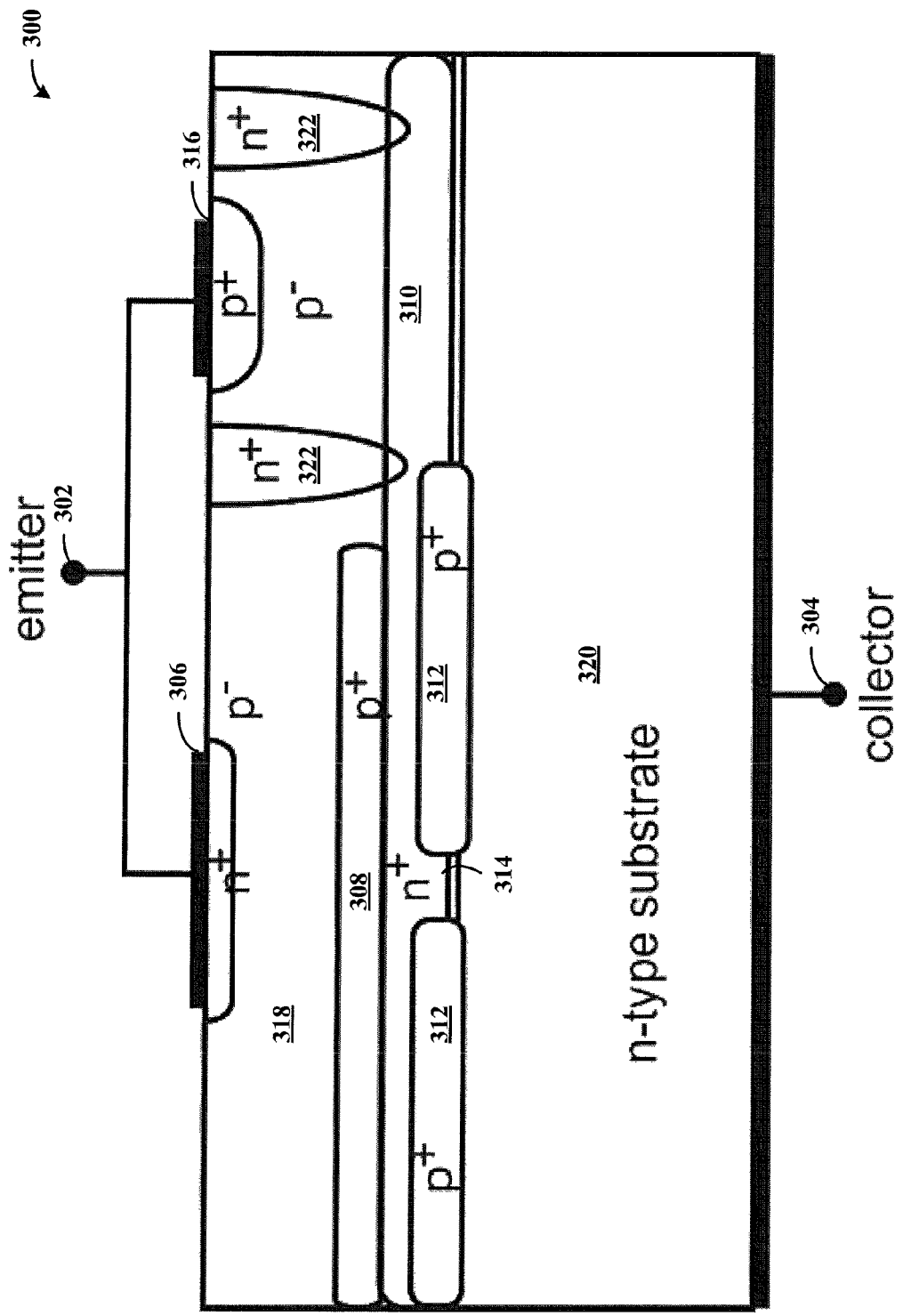
FIG. 3 shows another vertical implementation of an ESD protection device, consistent with an embodiment of the present disclosure.

FIG. 3 shows another vertical implementation of an ESD protection device 300, consistent with another embodiment of the present disclosure. The ESD protection device 300 has an N-type substrate 320 that is connected to an external contact at collector 304 and two other external contacts at emitter 302. The emitter 302 is connected to N-type region 306, which acts as an emitter region. N-type region 306 is highly doped, and is diffused in a lightly doped P-type epitaxial layer 318. N-type diffusion regions 322 are placed around P-type region 316. P-type region 316 acts as a parallel diode in connection with N-type region 310. A P-type buried layer 308 acts as an open base. Along with N-type region 306 and N-type buried layer 310, P-type buried layer 308 forms a transistor. P-type buried layer 312 includes holes and/or gaps at which an internal resistor 314 is located, and which prevents N-type layer 310 from being isolated from the N-type substrate 320. Accordingly, a second transistor including N-type layer 310, P-type layer 312 and N-type substrate 320 does not have isolation between the emitter and collector. The P-type regions 308 and 312 are floating.

If sufficiently high negative bias (larger than the breakdown voltage of the transistor including regions 306, 308 and 310) is applied to the emitter 302, the transistor opens and current flows through the resistor 314 to ground. The doping concentrations of the layers and geometrical dimensions of layer 312 determine the resistance of the internal resistor 314. The transistor made of regions 310, 312 and substrate 320 does not open when the transistor including regions 310, 312 and substrate 320 has not reached its breakdown voltage (at which the open-base transistor passes current). Accordingly, the effective feedback loop provided by circuit device 300 used to protect against ESD is not turned on and no thyristor action occurs prior to the transistor reaching the breakdown voltage. Once the transistor breaks down and allows current to flow, the feedback loop is initiated and the thyristor including regions 306, 308, 310 and 312 switches to an on-state. As current decreases at the end of the pulse the resistor 314 pulls the voltage drop across the transistor below the transistor's breakdown voltage and current conducted by the transistor including regions 310, 312 and substrate 320 stops.

Figure 4:
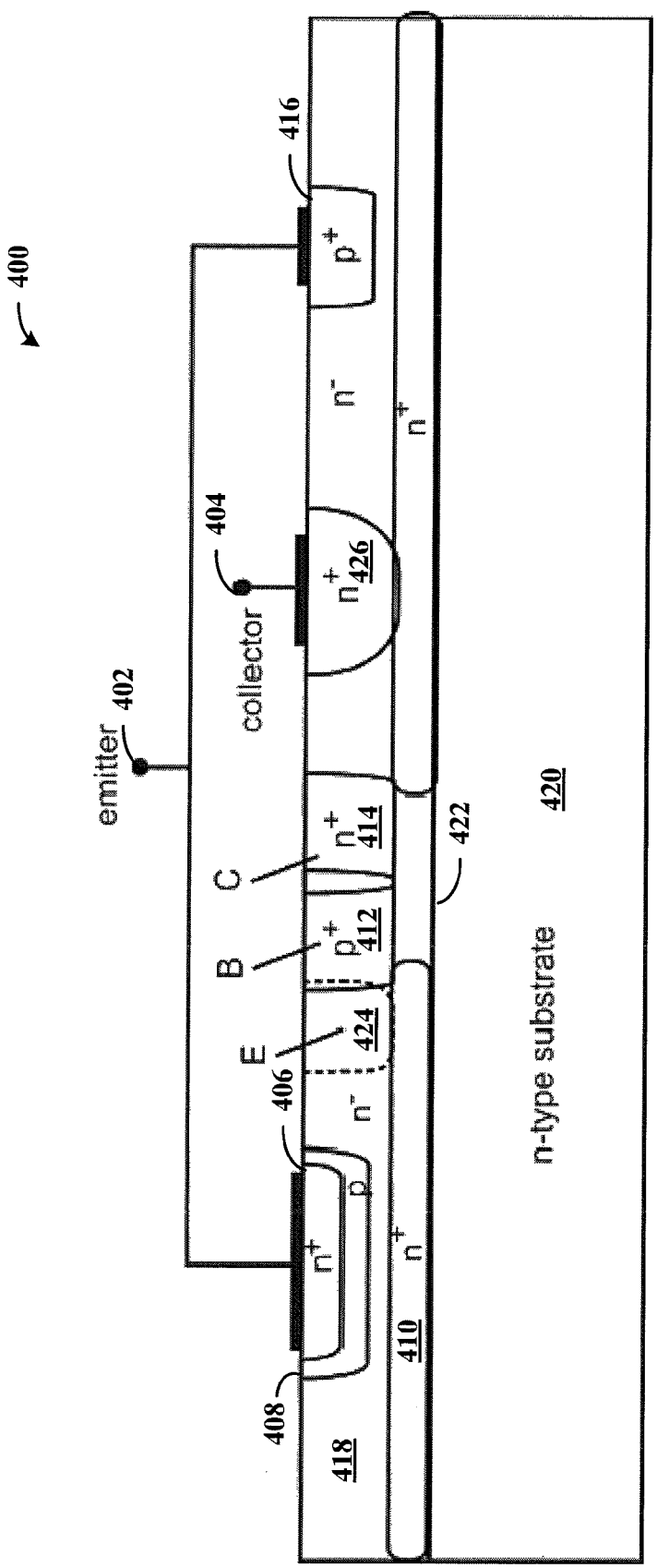
FIG. 4 shows a lateral implementation of an ESD protection device, consistent with an embodiment of the present disclosure.

FIG. 4 shows a lateral implementation of an ESD protection device 400, consistent with another embodiment of the present disclosure. An emitter 402 and a collector 404 for the ESD protection device 400 are both located on the upper surface of a semiconductor body and current flows laterally through the device. An N-type diffused region 406 is connected to an external contact and emitter 402. A P-type diffusion region 408 acts as an open base. The ESD protection device also includes a buried N-type layer 410 on top of N-type substrate 420. The N-type region 406 and P-type region 408, along with the portion of the lightly doped N-type epitaxial layer 418 surrounding the P-type region, function as an npn transistor. In some implementations, a region 424 of the epitaxial layer 418 is diffused with additional n-type material. Epitaxial layer 418, P-type base region 412 and N-type collector region 414 function as a second npn transistor. During manufacture, the dimensions of opening 422 below regions 412 and 414 are used to set the current when the lateral transistor, including epitaxial layer 418, base 412 and collector 414, is turned on. An N-type diffusion region 426 connects the collector 404 to the N-type buried layer 410 and N-type substrate 420. This allows for current to flow in the lateral direction. The device 400 may also include an optional P-type region 416 that forms a diode with layer 418.

Figure 5:
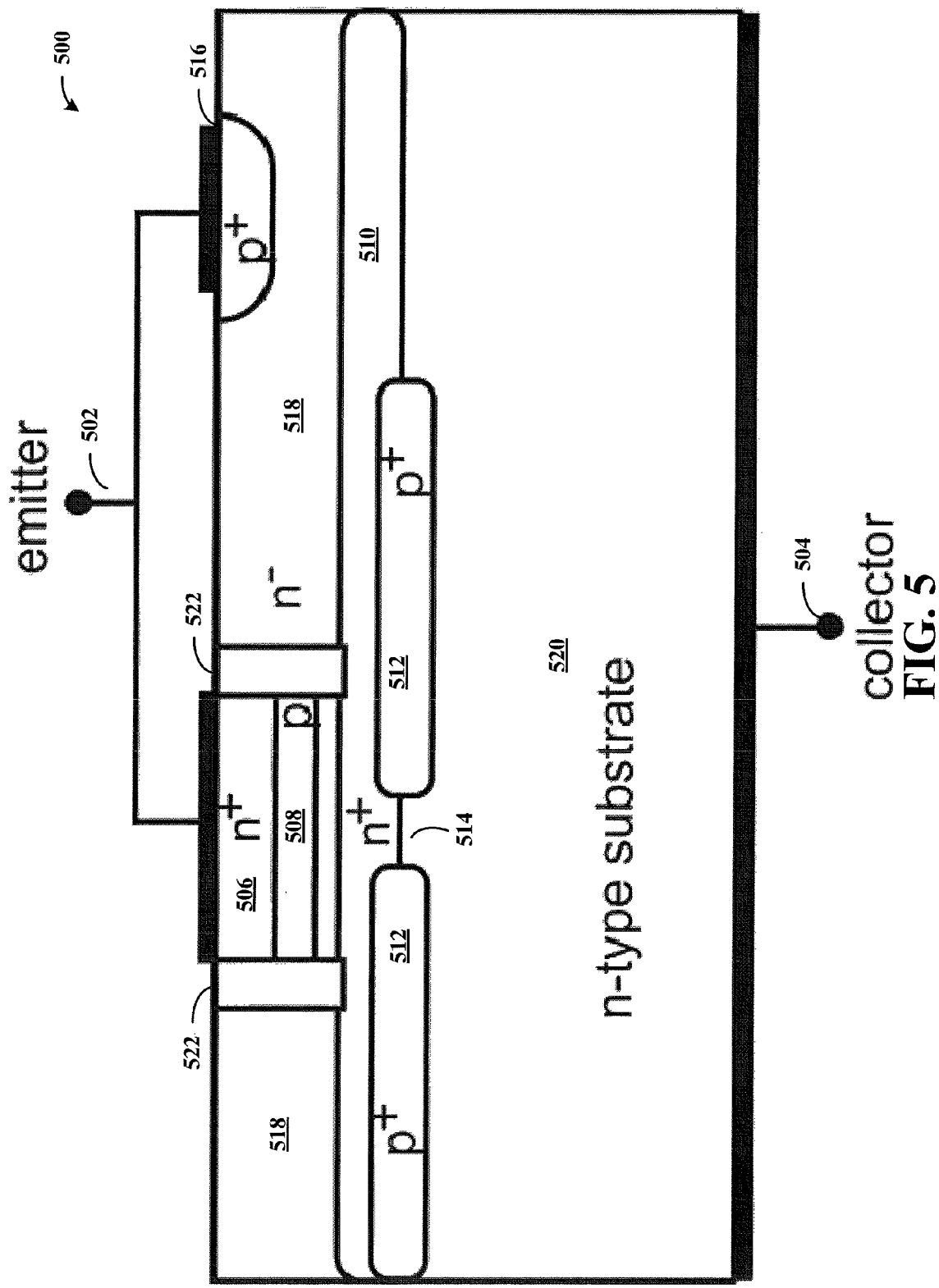
FIG. 5 shows another vertical implementation of an ESD protection device, consistent with an embodiment of the present disclosure.

FIG. 5 shows another vertical implementation of an ESD protection device 500, consistent with another embodiment of the present disclosure. Emitter 502 is connected to the upper surface of a semiconductor body and collector 504 is connected to the semiconductor body on the oppose side of N-type substrate 520. A first transistor including an N-type emitter region 506 and an open base P-type region 508 is isolated from the lightly doped N-type epitaxial layer 518 by trenches 522. Buried N-type layer 510 acts as a collector for the first transistor. A second transistor consists of buried N-type layer 510, buried P-type layer 512, and N-type substrate 520. The P-type layer 512 is discontinuous, with region 514 acting as an internal resistor. In some implementations, the device 500 also includes a P-type diffusion region 516 that forms a diode in parallel with the transistors making up the ESD protection device.

If sufficiently high negative bias, larger than the breakdown voltage of the transistor including of regions 506, 508 and 510 is applied to the emitter, the transistor opens and current flows through the resistor 514 to ground. The doping concentrations of the layers and geometrical dimensions of layer 512 determine the resistance of the internal resistor 514. The transistor made of regions 510, 512 and substrate 520 does not open when the transistor including regions 512 and substrate 520 has not reached its breakdown voltage. Accordingly, the feedback loop used to protect against ESD as provided by device 500 is not turned on and no thyristor action occurs prior to the transistor reaching its breakdown voltage. Once the transistor breaks down and allows current to flow, the feedback loop is initiated and the thyristor including regions 506, 508, 510 and 512 switches to an on-state. As current decreases at the end of the pulse, the resistor 514 pulls the voltage drop across the transistor below the breakdown voltage and current conducted by the transistor including regions 510, 512 and substrate 520 stops.

Figure 6:
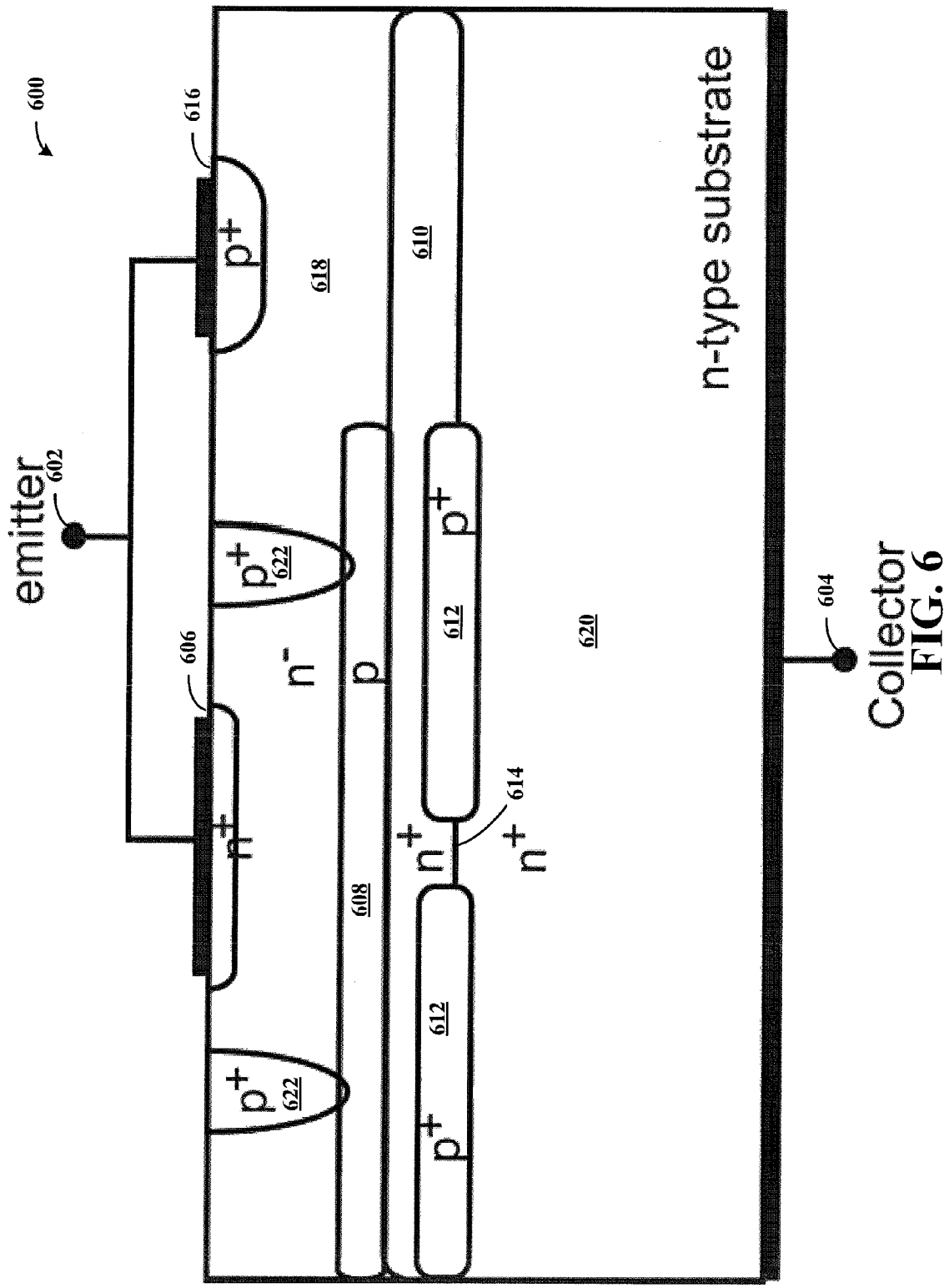
FIG. 6 shows another vertical implementation of an ESD protection device, consistent with an embodiment of the present disclosure.

FIG. 6 shows another vertical implementation of an ESD protection device 600, consistent with another embodiment of the present disclosure. The device 600 is similar to the device 200 shown in FIG. 2, with a buried layer 608 that is a P-type base region. P-type diffusion regions 622 create an N-type island in epitaxial layer 618 connected to P-type layer 608. A buried N-type layer 610 completes a first transistor along with N-type region 606 and buried P-type layer 608. A second P-type buried layer 612 has at least one internal resistor (e.g., hole-type) region 614. A second transistor consists of N-type layer 610, P-type layer 612 and N-type substrate 620. An optional diode includes P-type diffused region 616, and is arranged in parallel with at least the first transistor.

Figure 7:
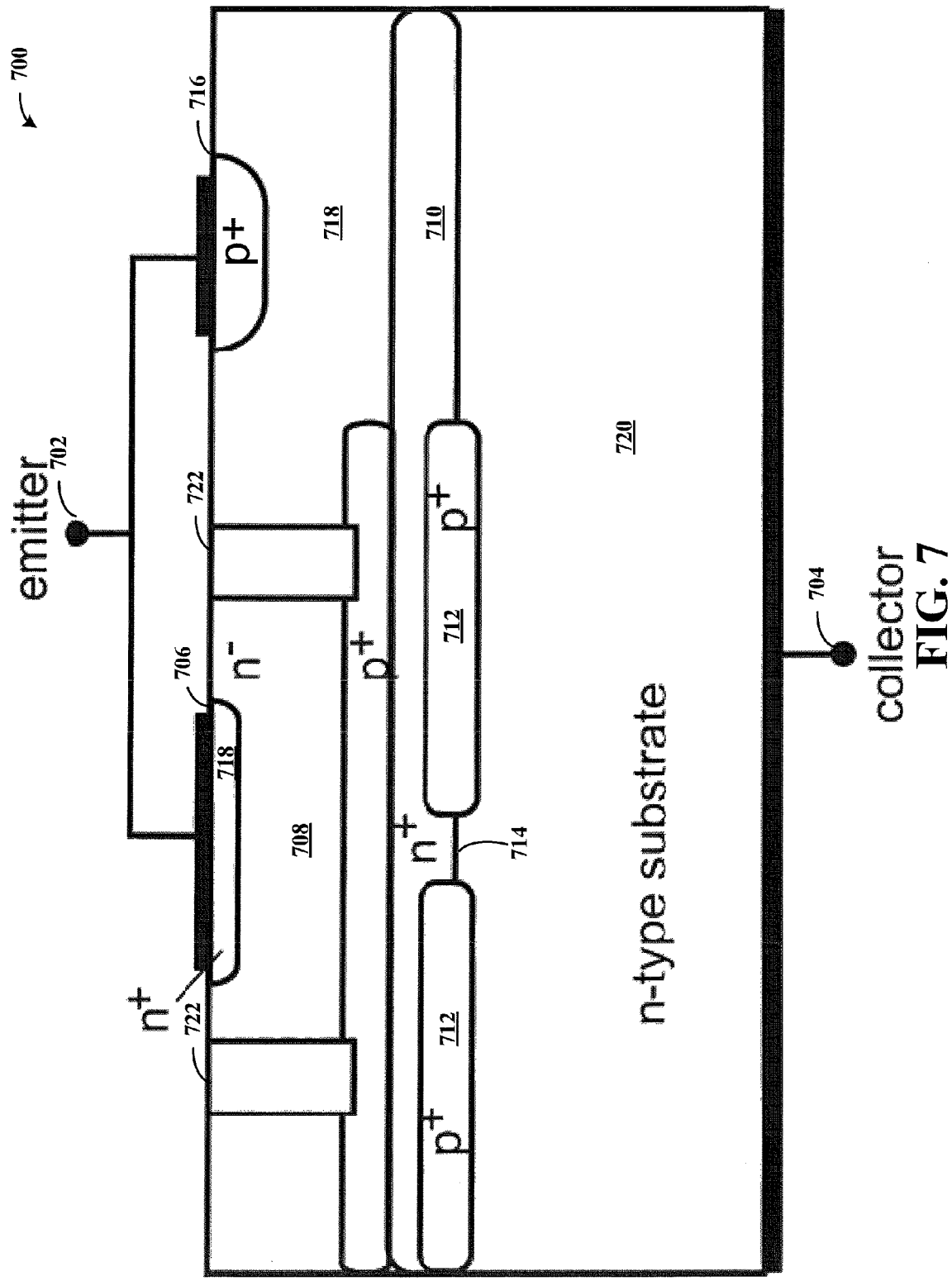
FIG. 7 shows a vertical implementation of an ESD protection device with trenches for vertical isolation, consistent with an embodiment of the present disclosure.

FIG. 7 shows another vertical implementation of an ESD protection device 700. The ESD protection device 700 includes an emitter 702 connected to the upper surface of a semiconductor body and a collector 704 connected to the bottom surface of the semiconductor body. The semiconductor body includes an N-type substrate 720. A buried P-type layer 712 is diffused on top of the N-type substrate 720. The buried P-type layer 712 is not continuous. There is at least one resistor 714 at a gap in the P-type layer 712. An internal resistor 714 is formed at a discontinuity or gap in the layer 712. A buried N-type layer 710 is diffused on top of P-type layer 712. A second buried P-type layer 708 is diffused on top of N-type layer 710. A lightly doped N-type layer 718 is grown on top of P-type layer 708. N-type region 706 is diffused in the epitaxial layer. Trenches 722 are used to create an N-type island that connects the N-type region 706 to P-type buried layer 708. Region 706, layer 708 and layer 710 act as a first transistor. Layer 710, layer 712 and substrate 720 act as a second transistor. Resistor 714 connects layer 710 and substrate 720, with current flowing through the resistor until the breakdown voltage of the transistor including layer 710, layer 712 and substrate 720 is reached. At that time, current also flows through buried layer 712. An optional diode is implemented in parallel to the transistors with P-type region 716.

Figure 8:
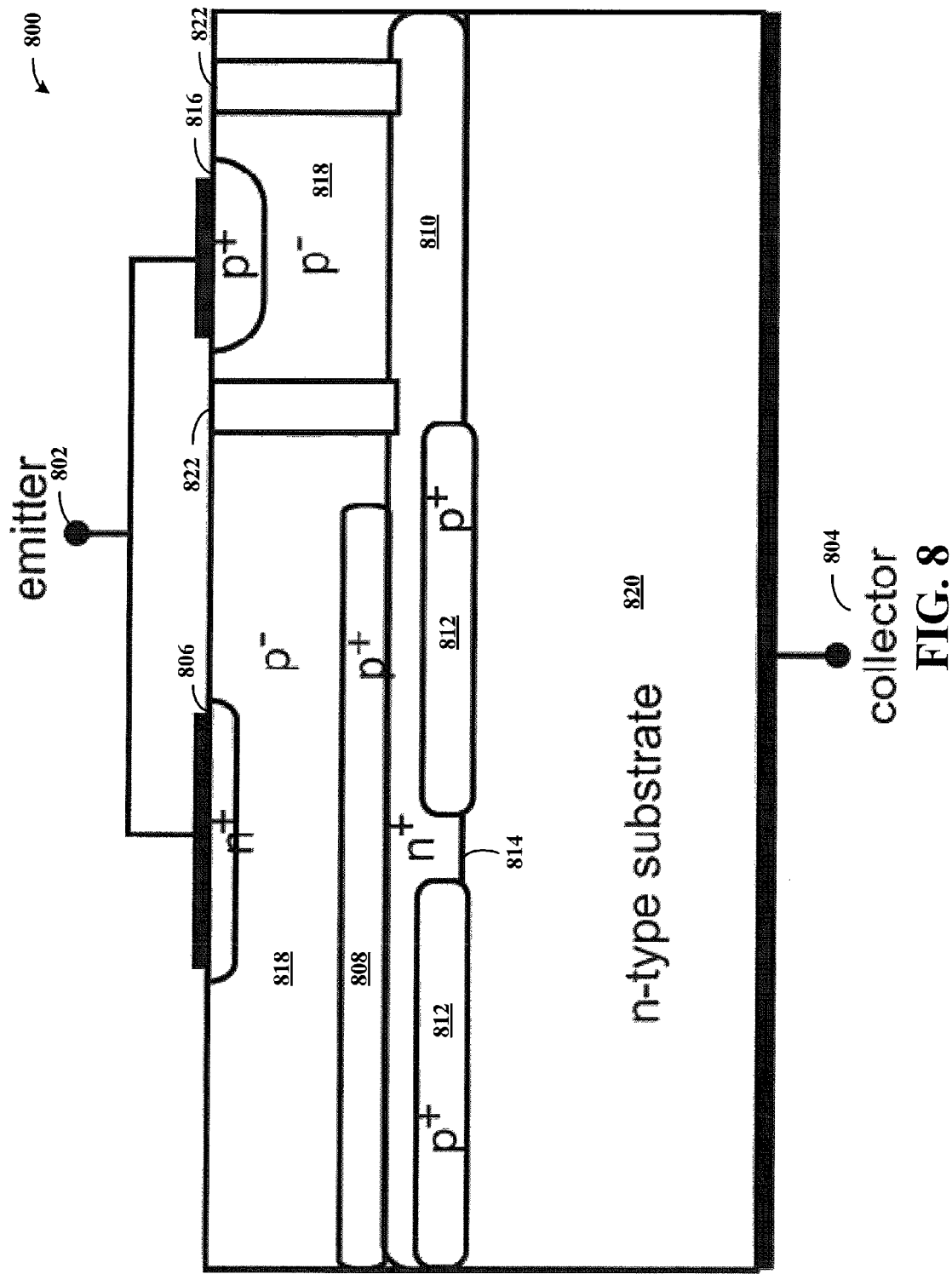
FIG. 8 shows another vertical implementation of an ESD protection device with trenches for vertical isolation, consistent with an embodiment of the present disclosure.

FIG. 8 shows another vertical implementation of an ESD protection device 800, consistent with another embodiment of the present disclosure. An emitter 802 and a collector 804 are on opposite sides of a semiconductor body. The semiconductor body includes an N-type substrate 820. A buried P-type layer 812 is diffused on top of the N-type substrate 820. The buried P-type layer 812 includes at least one gap or discontinuity at resistor 814. On top of buried P-type layer 812 an N-type buried layer 810 is diffused. The N-type layer 810, buried P-type layer 812 and N-type substrate 820 act as a transistor. On top of buried N-type layer 810, a second buried P-type layer 808 is diffused. A lightly doped P-type epitaxial layer 818 is grown on top of P-type buried layer 808. An N-type region 806 is diffused in the epitaxial layer and connected to emitter 802. An optional diode including P-type diffusion region 816 is isolated in the epitaxial layer 818 by trenches 822.

Figure 9:
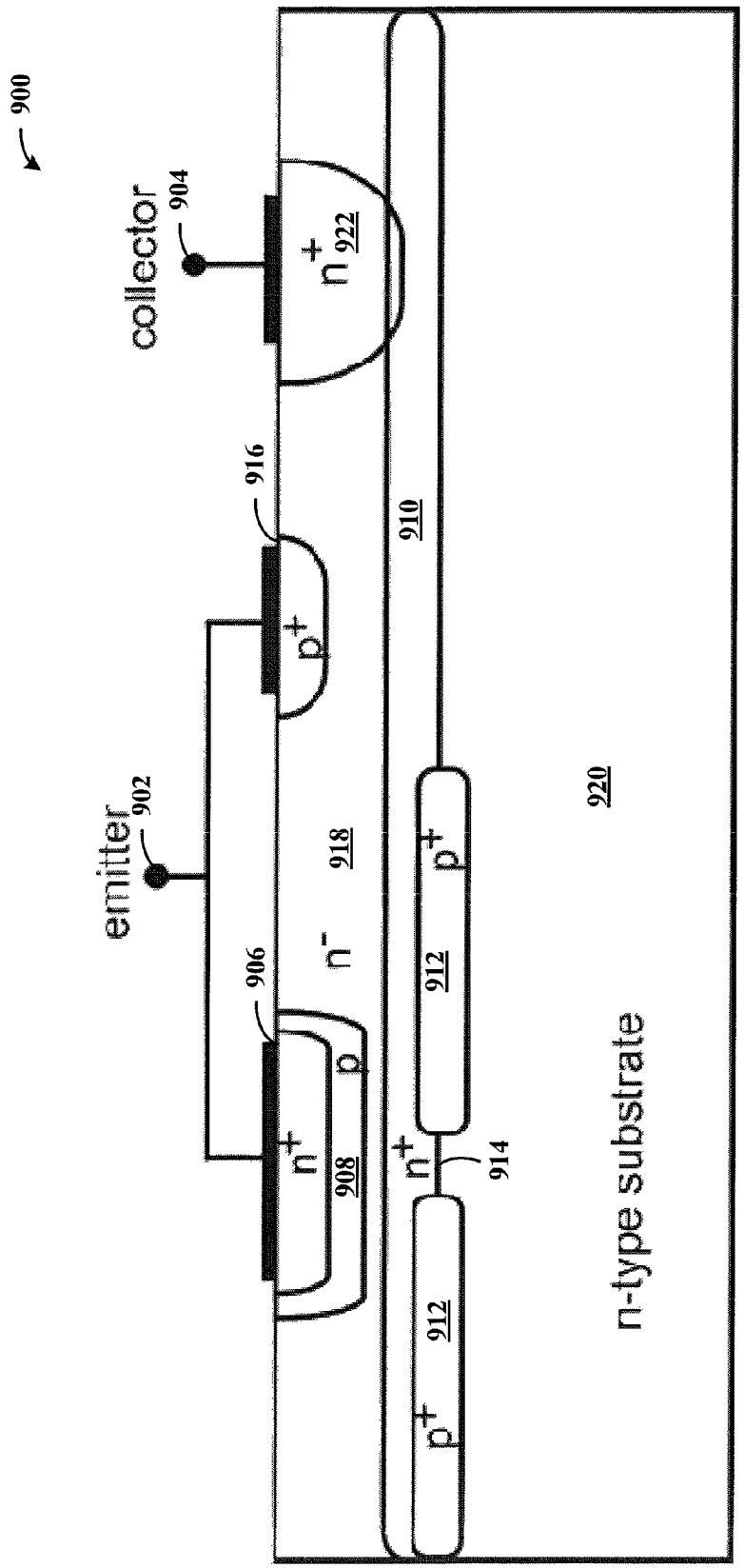
FIG. 9 shows a lateral implementation of an ESD protection device, consistent with an embodiment of the present disclosure.

FIG. 9 shows another lateral implementation of an ESD protection device 900, consistent with another embodiment of the present disclosure. A collector 904 is located on the same surface as an emitter 902, and with an N-type diffusion region 922 connecting the collector to a buried N-type layer 910. In the embodiment depicted, a P-type buried layer 912 is diffused on top of N-type substrate 920. P-type buried layer 912 is not continuous, with a hole or gap in the layer forming a resistor 914 connecting the N-type substrate 920 to the buried N-type layer 910. An N-type region 906 is diffused in lightly doped N-type epitaxial layer 918. A P-type region 908 is also diffused in the epitaxial layer 918, and acts as an open base. An optional diode includes P-type region 916.

Figure 10:
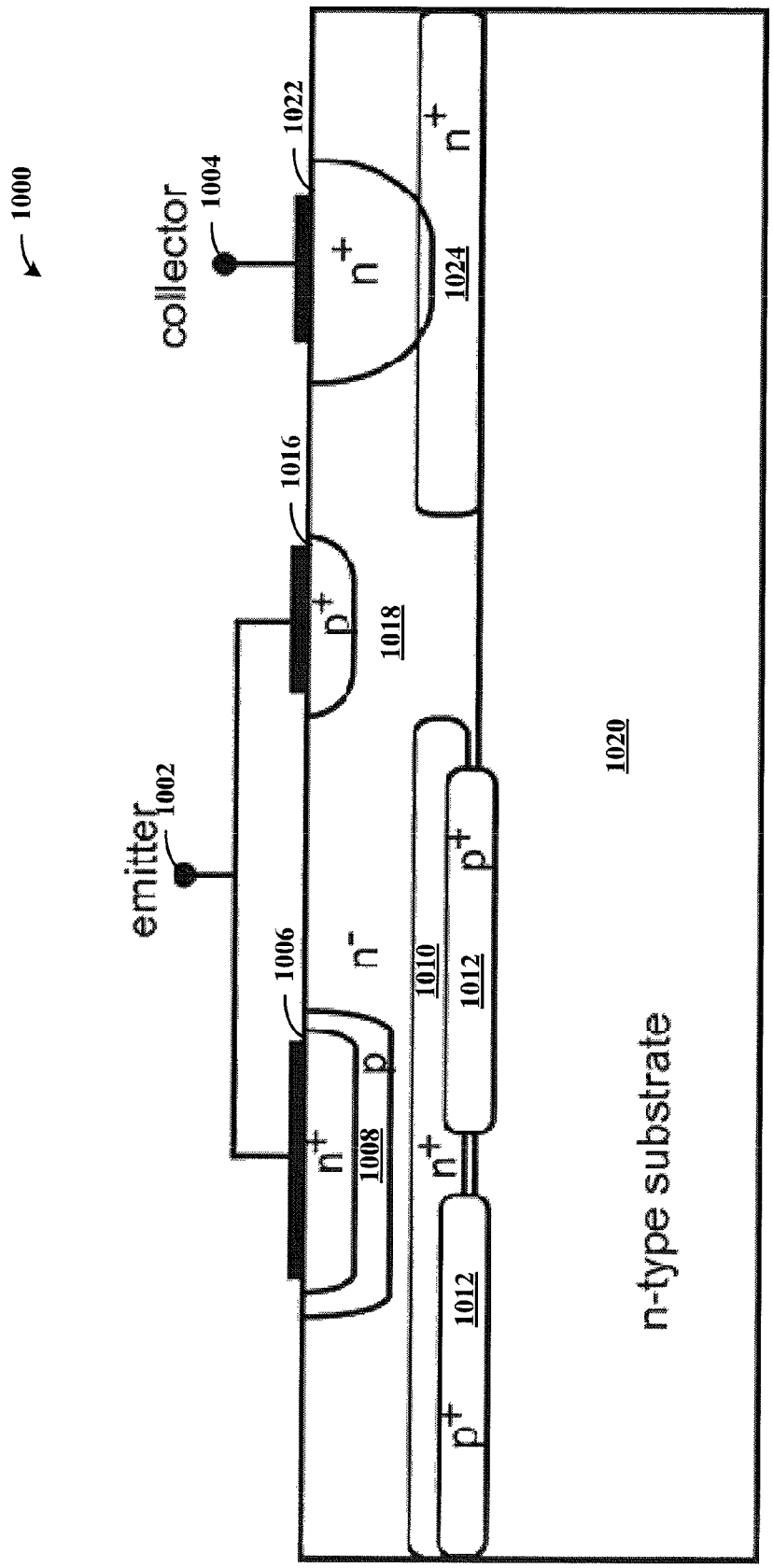
FIG. 10 shows another lateral implementation of an ESD protection device, consistent with an embodiment of the present disclosure.

FIG. 10 shows another lateral implementation of an ESD protection device 1000, consistent with another embodiment of the present disclosure. The ESD protection device 1000 includes an N-type substrate 1020. A P-type buried layer 1012 is diffused on top of the N-type substrate 1020. The P-type buried layer is not continuous, with at least one hole or discontinuity forming an internal resistor 1014. An N-type buried layer is structured into two portions, N-type region 1010 and N-type region 1024. The break between the two regions ensures that current flows through layer 1012 when the ESD protection device is on. N-type diffusion region 1022 connects collector 1004 to section 1024. The emitter 1002 is connected to N-type region 1006. P-type region 1008 surrounds region 1006 and acts as an open base. Regions 1006, 1008, 1016 and 1022 are diffused into lightly doped N-type epitaxial layer 1018. P-type region 1016 is part of an optional diode.

Figure 11:
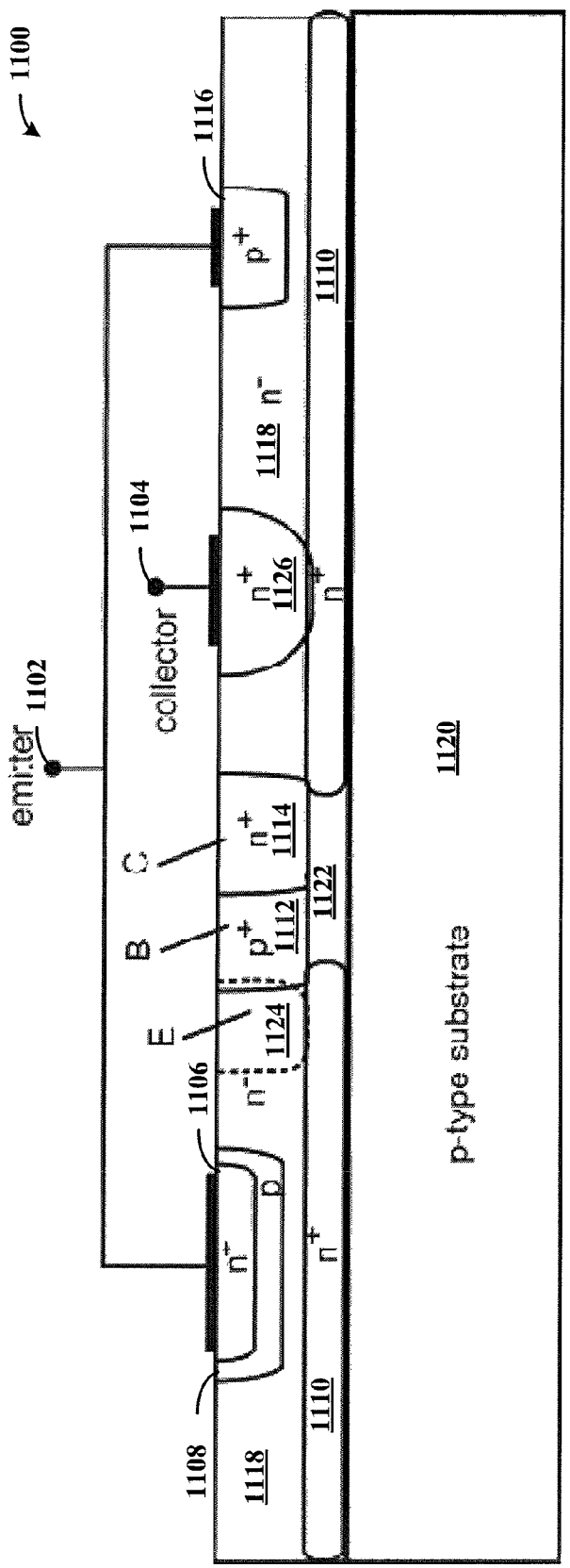
FIG. 11 shows another lateral implementation of an ESD protection device, consistent with an embodiment of the present disclosure.

FIG. 11 shows another lateral implementation of an ESD protection device 1100, consistent with another embodiment of the present disclosure. An emitter 1102 and a collector 1104 are connected on the same side of a semiconductor body. The semiconductor body includes a P-type substrate 1120 and an N-type buried layer 1110 diffused on top of the P-type substrate. A resistor at a gap 1122 in layer 1110 is used to set the current threshold at which the ESD protection device turns on, to shunt current via N-type buried layer 1110. A lightly doped N-type epitaxial layer 1118 is grown on top of N-type buried layer 1110. The emitter 1102 is connected to an N-type diffused region 1106 that is formed in an open-base P-type region 1108. In some implementations, a region 1124 of the N-type region 1114 is a highly doped N-type region. The lightly doped N-type epitaxial region 1118 acts as the collector for a first transistor with regions 1106 and 1108. A second transistor optionally includes region 1124, P-type region 1112, which also acts as an open base, and N-type region 1114. An optional diode includes P-type region 1116.

Based upon the above discussion and illustrations, those skilled in the art will readily recognize that various modifications and changes may be made to the present invention without strictly following the exemplary embodiments and applications illustrated and described herein. For example, the various vertical implementations as shown can be implemented in a horizontal arrangement, with emitter and collector of an ESD device ant an upper surface of a substrate (e.g., as in FIG. 4). The various horizontal implementations may also be implemented vertically, with the lateral emitter/collector regions arranged in a vertical structure with a buried collector (e.g., as in FIG. 2). In addition, the polarity of various regions may be altered, to switch P-type regions with N-type regions. Such modifications do not depart from the true spirit and scope of the present invention, including that set forth in the following claims.

What is claimed is:

1. An ESD protection device comprising:
a plurality of contiguous semiconductor regions of alternating conductivity type including first and second regions that form a first P-N junction therebetween, a third region that forms a P-N junction with the second region, a fourth region that forms a P-N junction with the third region and a fifth region that forms a P-N junction with the fourth region;
a first contact connected to the first region;
a second contact connected to the fifth region;
a resistor connected between the third region and the fifth region;
the resistor and the first, second, third and fifth regions forming a first current path configured to flow current between the first and second contacts via the first and fifth regions in response to a voltage at the exceeding a breakdown threshold of a first transistor formed by the first, second and third regions; and
the first, second, third, fourth and fifth regions forming a second current path configured to flow current between the first and second contacts via the first and fifth regions in response to the current across the resistor exceeding a threshold at which the voltage across a second transistor formed by the third, fourth and fifth regions reaches a breakdown voltage of the second transistor.

2. The device of claim 1, wherein the second and fourth regions are not connected to an external contact.

3. The device of claim 1, wherein the first, second and third regions form a transistor having a breakdown voltage at which the first current path flows current.

4. The device of claim 1, wherein the third, fourth and fifth regions form a transistor having a breakdown voltage at which the second current path flows current.

5. The device of claim 1, wherein
the first, second and third regions form a first transistor having a first breakdown voltage at which the first transistor turns on to flow current through the first, second and third regions, and
the third, fourth and fifth regions form a second transistor having a second breakdown voltage at which the second transistor turns on to flow current via the second current path.

6. The device of claim 1, the first current path being configured to flow current in response to a voltage applied to the first external contact exceeding a first breakdown voltage at which the P-N junction between the second and third regions breaks down.

7. The device of claim 1, the second current path being configured to flow current in response to a voltage applied to the first external contact resulting in a current through the resistor that is above the current threshold and that causes a voltage drop across the P-N junction between the fourth and fifth regions causing a breakdown of the P-N junction.

8. A device comprising:
a bipolar transistor having an emitter, a collector and a base, the emitter connected to a first external contact;
a thyristor having four regions of alternating P-type and N-type semiconductor material, including
a first end region connected to the base of the bipolar transistor, the first end region and the base of the bipolar transistor being made of the same type of semiconductor material,
a first intermediate region forming a P-N junction with the first end region and connected to the collector of the bipolar resistor, the first intermediate region and the collector of the bipolar transistor being made of the same type of semiconductor material,
a second intermediate region forming a P-N junction with the first intermediate region, the second intermediate region being made of the same type of semiconductor material as the first end region, and
a second end region forming a P-N junction with the second intermediate region and connected to a second external contact, the second end region being made of the same type of material as the first intermediate region; and
a resistor connected to the collector of the bipolar transistor, the first intermediate region of the thyristor and the second end region of the thyristor.

9. The device of claim 8, wherein
the emitter of the bipolar transistor is coupled to an external circuit susceptible to an ESD event, and
the thyristor is configured and arranged to turn on in response to a current greater than an operating current of the external circuit.

10. The device of claim 8, wherein the resistance value of the resistor sets a threshold current at which the thyristor turns on.

11. The device of claim 8, wherein the first external contact is at an upper surface of a semiconductor substrate in which the device is formed, and the second external contact is coupled to a collector at a lower surface of the semiconductor substrate.

12. The device of claim 8, wherein the first and second external contacts are on the same surface of a semiconductor substrate in which the device is formed and configured to laterally pass current.

13. The device of claim 8, further including a P-type region connected to a third external contact, the third external contact connected to the first external contact.

14. The device of claim 8, wherein, in response to an ESD pulse, the bipolar transistor reaches breakdown voltage and conducts current before the thyristor reaches breakdown voltage and conducts current.

15. The device of claim 8, wherein the base of the bipolar transistor is not connected to an external contact.

16. The device of claim 8, wherein the emitter and base are connected by another resistor.

17. The device of claim 8, wherein
the bipolar transistor has a breakdown voltage at which the bipolar transistor turns on to flow current between the first external contact and the resistor, and
the thyristor has a trigger voltage at which the thyristor turns on to flow current between the first and second end regions.

18. The device of claim 8, wherein
the bipolar transistor has a breakdown voltage at which the bipolar transistor turns on to flow current between the first external contact and the resistor,
the thyristor has a trigger voltage at which the thyristor turns on to flow current between the first and second end regions,
in response to the onset of an ESD event in which the voltage at the first external contact exceeds the breakdown voltage, the bipolar transistor turns on and flows current from the first contact to the resistor, and through the resistor to the second contact, and
in response to the voltage drop across the resistor exceeding the trigger threshold via the current passing through the resistor, the thyristor turns on and passes current from the bipolar transistor to the second contact, via the thyristor.

19. For use with an electrostatic discharge (ESD) circuit having a plurality of contiguous semiconductor regions of alternating conductivity type including first and second regions that form a first P-N junction therebetween, a third region that forms a P-N junction with the second region, a fourth region that forms a P-N junction with the third region and a fifth region that forms a P-N junction with the fourth region, and a resistor being connected between the third region and the fifth region, the first region being connected to a first contact susceptible to an ESD pulse, the fifth region being connected to a second contact, a method for shunting current between the first and second contacts, the method comprising:

in response to a voltage at the first contact that causes a voltage drop across a first transistor formed by the first, second and third regions to exceed a threshold voltage of the first transistor, flowing current through a first current path between the first and second contacts, the first current path including the first transistor, the resistor and the fifth region; and in response to the current flowing through the resistor in the first current path exceeding a threshold at which the voltage across the resistor and correspondingly across a second transistor formed by the third, fourth and fifth regions reaches a breakdown voltage of the second transistor, flowing current through a second current path between the first and second contacts, the second current path including the first, second, third, fourth and fifth regions.

20. The method of claim 19, further including, after the voltage across the second transistor reaches the breakdown voltage of the second transistor, continuing to flow current via a thyristor formed by the second, third, fourth and fifth regions at a voltage level across the thyristor corresponding to a trigger voltage of the thyristor that is reduced, relative to the breakdown voltage of the first transistor.

\* \* \* \* \*